(12) United States Patent
McCullough et al.

(10) Patent No.: US 8,768,636 B2
(45) Date of Patent: Jul. 1, 2014

(54) SYSTEM AND METHOD FOR DETECTING IMPAIRED ELECTRIC POWER EQUIPMENT

(75) Inventors: Jason McCullough, Canal Winchester, OH (US); Raymond M. Hayes, Lancaster, OH (US); David A. Klinect, Reynoldsburg, OH (US)

(73) Assignee: Exacter, Inc, Columbus, OH (US)

( * ) Notice: Subject to any disclaimer, the term of this patent is extended or adjusted under 35 U.S.C. 154(b) by 1299 days.

(21) Appl. No.: 12/333,388

(22) Filed: Dec. 12, 2008

(65) Prior Publication Data
US 2009/0192736 A1 Jul. 30, 2009

Related U.S. Application Data

(63) Continuation-in-part of application No. 11/139,192, filed on May 27, 2005, now Pat. No. 7,467,049.

(51) Int. Cl.
*G01R 21/00* (2006.01)
(52) U.S. Cl.
USPC .......................................................... 702/60
(58) Field of Classification Search
USPC .......................................................... 702/60
See application file for complete search history.

(56) References Cited

U.S. PATENT DOCUMENTS

| | | | |
|---|---|---|---|
| 4,731,586 A | 3/1988 | Perkins | |
| 5,223,795 A | 6/1993 | Blades | |
| 5,294,937 A | 3/1994 | Ostteen et al. | |
| 5,477,150 A | 12/1995 | Ham et al. | |
| 5,512,843 A | 4/1996 | Haynes | |
| 5,608,328 A | 3/1997 | Sanderson | |
| 5,657,244 A | 8/1997 | Seitz | |
| 5,729,144 A | 3/1998 | Cummins | |
| 5,982,165 A | 11/1999 | Bowyer et al. | |
| 6,005,518 A | 12/1999 | Kallina | |
| 6,242,922 B1 | 6/2001 | Daum et al. | |
| 6,384,776 B1 | 5/2002 | Martin | |
| 6,707,407 B2 | 3/2004 | Troy et al. | |
| 6,751,528 B1 | 6/2004 | Dougherty | |
| 6,766,226 B2 | 7/2004 | Anderson | |
| 7,254,004 B2 | 8/2007 | Mladenik et al. | |
| 2004/0210938 A1 | 10/2004 | Eckenroth et al. | |
| 2005/0018371 A1 | 1/2005 | Mladenik et al. | |
| 2008/0027663 A1 | 1/2008 | Anderson et al. | |

OTHER PUBLICATIONS

Emanuel, A.E., et al., High Impedance Fault Arcing on Sandy Soil in 15kV Distribution Feeders: Contributions to the Evaluation of the Low Frequency Spectrum, IEEE Transactions on Power Delivery, Apr. 1990, pp. 676-686, vol. 5, No. 2.

Loftness, Marv, AC Power Interference Handbook, New Insights into the Causes, Effects, Locating, and Correction of Power-Line and Other Electrical Interference, 2003, exemplary pages of interest 1-4 to 1-7; 1-12 to 1-17; 1-20 to 1-21; 2-6 to 2-7; 3-1 to 3-3; 4-2 to 4-9; 4-12 to 4-15; 6-8 to 6-9; 7-1 to 7-17; 8-10 to 8-11; and 12-14 to 12-15, Published by Percival Technology, Tumwater, Washington.

(Continued)

*Primary Examiner* — Tung S Lau
(74) *Attorney, Agent, or Firm* — Okuley Smith, LLC

(57) ABSTRACT

A system and method for detecting impaired electric power equipment. An exemplary embodiment may receive electromagnetic radiation and process the resulting signal. For example, signal processing may be used to identify electromagnetic radiation having a particular pattern that is characteristic of electric power equipment. Furthermore, an embodiment may determine the time and/or location during testing. As a result, an exemplary embodiment may be useful for stationary and/or mobile testing of an electrical system.

13 Claims, 8 Drawing Sheets

(56) References Cited

OTHER PUBLICATIONS

Moell, Joseph D., et al., Transmitter Hunting Radio Direction Finding Simplified, 1987, exemplary pages of interest 4-22; 71-98; and 265, Published by TAB Books, USA.
"Transmission System Planning and Performance, Radio Interference Compliance Testing," Kinectrics, Inc., T&D-SP, 2 pages, Oct. 15, 2003.
"The Correct Choice Towards Providing Carrier-Grade Timing Reliability," M12+ Timing OncoreTM Receiver, Motorola GPS products—Oncore User's Guide, Revision 5.0, 5 pages, Aug. 20, 2002.
"Texas Instruments Enters Digital Signal-Processor Chip Market With High-Speed TMS320," History of Innovation, Texas Instruments, 2 pages, Jun. 17, 2004, http://www.ti.com/corp/docs/company/history/82dspnews.shtml.
"Product Folder: TMS 320C31—Ditigal Signal Processor," Texas Instruments, 6 pages, Jun. 17, 2004, http://focus.ti.com/docs/prod/folders/print/tms320c31.html.
TMS320C31, TMS320LC31, Digital Signal Processors, Texas Instruments, 48 pages, SPRS035B, Mar. 1996, Revised Jan. 1999.
http://209.161.33.50/dictionary/modulation, p. 1.
The ARRL RFI Book, Practical Cures for Radio Frequency Interference, exemplary pages of interest 11.27 to 11.34, 2nd Edition, publication No. 235 of the Radio Amateurs Library, Published by ARRL, USA.
Loftness, Marv, AC Power Interference Handbook, New Insights into the Causes, Effects, Locating, and Correction of Power-Line and Other Electrical Interference, 2003, exemplary pages of interest 1-1 to 1-11, Published by Percival Technology, Tumwater, Washington.
Search Report and Written Opinion from PCT/US2009/067659.

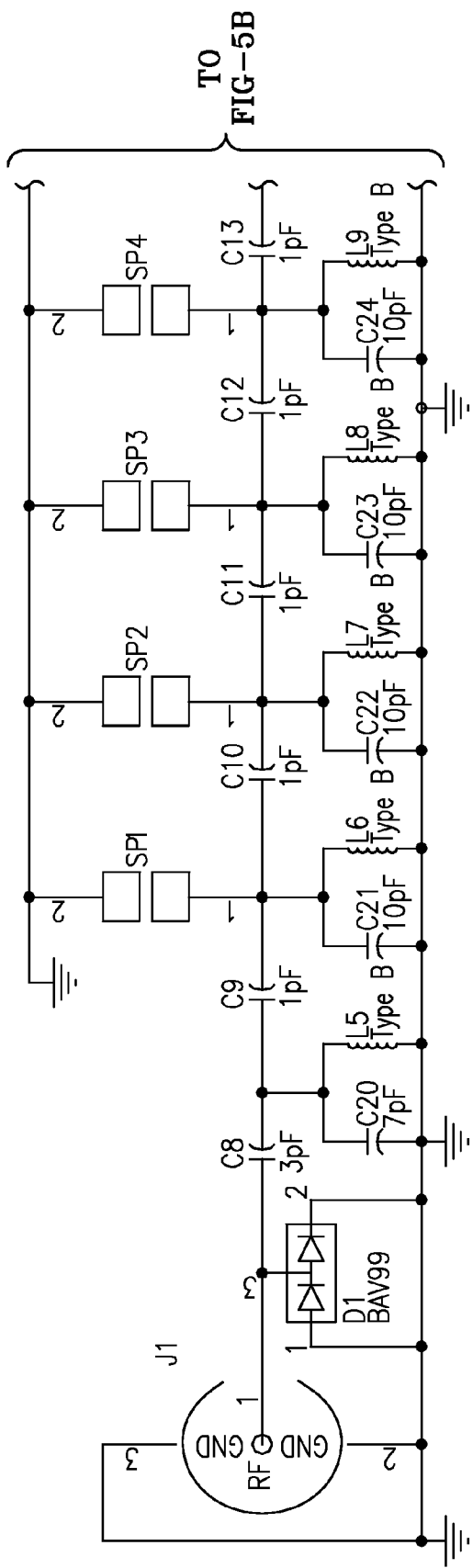

SYSTEM AND METHOD FOR DETECTING IMPAIRED ELECTRIC POWER EQUIPMENT

This is a continuation-in-part of U.S. application Ser. No. 11/139,192, filed May 27, 2005, which is hereby incorporated by reference in its entirety.

BACKGROUND AND SUMMARY OF THE INVENTION

Exemplary embodiments of the present invention relate generally to a system and method for identifying impaired electrical equipment. More particularly, some exemplary embodiments of the present invention relate to a system and method for detecting impaired electric power equipment. Exemplary embodiments of the present invention may also be useful for testing various other types of electrical systems. Furthermore, exemplary embodiments of the present invention may be useful for stationary and/or mobile testing of various types of electrical systems.

Power generation, distribution, transmission, and substation systems are just some examples of electrical systems. Some other examples of electrical systems include radio systems, communication systems, control systems, industrial electrical systems, and other types of electrical circuitry and systems. In addition, many other types of electrical systems are known or may be developed.

Any type of electrical system may be responsible for creating electromagnetic radiation. Electromagnetic radiation includes radio frequency radiation as well as other frequencies of electromagnetic radiation. The underlying cause of the electromagnetic radiation may limit or disrupt the operation of the electrical system that is emitting the electromagnetic radiation. Moreover, electromagnetic radiation may also interfere with the operation of other electrical systems. In fact, many sophisticated electrical systems are becoming increasingly sensitive to the effects of electromagnetic radiation. Consequently, electromagnetic radiation may sometimes be referred to as electromagnetic interference (EMI). A common definition of EMI is "any electromagnetic disturbance that interrupts, obstructs, or otherwise degrades or limits the effective performance of electronics/electrical equipment."

The causes of electromagnetic radiation vary. Equipment such as electrical appliances, electronic equipment, motors, circuits, and other electrical systems can produce electromagnetic radiation, which can be influenced by the surrounding environment such as hills, trees, buildings, and other environmental factors. In addition, impaired electrical equipment may be the cause of an increased level of electromagnetic radiation. Other causes are also possible. Regardless of whether the cause of electromagnetic radiation is intentional or inadvertent, hostile or friendly, or caused by jamming devices, malfunctioning equipment, or improper system operation, the resulting electromagnetic radiation can have detrimental impact on the operation of electronics and other electrical systems.

A standard for defining power disturbances has been established by the Institute of Electrical and Electronics Engineers (IEEE) in order to help address the problems caused by electromagnetic interference. In particular, the "IEEE Recommended Practice for Monitoring Electrical Power Quality" defines electrical disturbances as interruptions, sags and swells, long duration variations, impulse transients, oscillatory transients, harmonic distortion, voltage fluctuations, and noise. In addition, the standard sets forth acceptable disturbance levels, and electrical equipment manufacturers use EMI (e.g., radio frequency interference) shielding techniques in attempts to meet the standard.

There has been growth in the level of EMI shielding that is required as well as in the number of new applications that require shielding. However, the development of new shielding technologies has not kept pace with the development of new electrical systems. In addition, enhancements to old shielding technologies have also lagged behind the development of new electrical systems. In fact, shielding of electrical systems from the effects of electromagnetic radiation is commonly viewed by manufacturers as adding little or no value to the electrical systems. Thus, the development of shielding has been relatively stagnant in recent history.

Compounding this problem is the fact that EMI detection techniques have not advanced rapidly enough in light of the development of new types of electrical systems. There are currently few research and development activities to develop new devices to identify the causes of EMI. As a result there are little to no quality commercial EMI diction devices available. Currently commercial EMI detectors suffer from poor construction and lack the tolerances necessary to reliably detect and locate EMI. Most commercial EMI detectors have a wide passband but still employ a shallow rolloff. Commercial EMI detectors only work with a particular frequency and lack the variety necessary to be effective. Another problem with most commercial EMI detectors is that they are susceptible to standing waves. This susceptibility to standing waves interferes with the EMI detectors ability to locate the disturbance. As a result, EMI is an increasing problem.

Power line arcing is one example of a cause of EMI. As a result of the high voltage, power line arcing may be destructive, and it may indicate that certain electrical equipment is in an impaired condition. In fact, any type of arcing may indicate that electrical equipment is in an impaired condition.

Arcing occurs when a sufficiently large potential difference develops between two objects. For example, a small gap between components of energized electrical equipment may lead to arcing, wherein an electrical charge builds up and discharges across the gap. The cause of a gap may simply be due to expansion and contraction or corrosion of the equipment. As a result, small gaps in the electrical equipment can be very difficult to identify. Compounding the difficulty is the fact that some electrical equipment such as power lines may be located well above ground level and energized with high voltage, making it impractical or inefficient for electrical utility personnel to visually inspect each structure or other elevated equipment in an attempt to locate an impaired piece of electrical equipment. Impaired equipment can still be difficult to locate even if the equipment is located near ground level. For instance, multiple pieces of electrical equipment in a general area such as a room, a factory building, or even a general outside area can hinder the detection of an impaired piece of equipment. As a result, the location of impaired electrical equipment may be difficult to identify.

In light of the difficulty in locating impaired electrical equipment, there is a need for a system and method for detecting impaired electrical equipment that may utilize the characteristics of the arcing. The pulse repetition rate is the rate at which arcing occurs across a gap, which may be measured by the number of arcs per unit time. The pulse repetition rate is typically proportional to the source voltage and inversely proportional to the width of the gap. Consequently, with everything else being equal, a higher voltage results in a higher pulse repetition rate, and a wider gap results in a lower pulse repetition rate. In addition to the pulse repetition rate, arcing has an RF frequency characteristic. In particular, arcing results in the production of a radio frequency signal. In the case of EMI, the signal is typically broad spectrum such that it is detectable across a wide band of the radio frequency spectrum. Each arc produces a radio frequency signal; therefore, as the width of the gap or the source voltage changes, the resulting radio frequency signal also changes. Other factors may also affect the RF frequency. For example, with regard to a utility pole, the RF frequency may also be affected by: the height of the utility pole; whether or not a ground wire runs along a side of the utility pole; the distance between the utility pole and adjacent poles; the components (e.g., insulators, cutouts, etc.) that are mounted at the top of the utility pole; and whether the utility pole is a single-phase or three-phase structure. Other factors may also impact the RF frequency. All of these parameters can and often do act as 'antenna tuning elements' that affect the signal that is radiated when an arc occurs. As a result, during any given 60 Hz cycle, for example, there may be a family of different RF signals produced. Finally, arcing may have a modulation frequency. The modulation frequency of the arcing is not dependent on the level of the source voltage or the width of a gap between electrical components. In this sense, the modulation frequency is an independent characteristic of the radio frequency signal(s) produced by arcing. In other words, with regard to arcing caused by an alternating current (AC) source, the modulation frequency is a characteristic of the frequency of the source.

Exemplary embodiments of the present invention are directed to a system and method for detecting impaired electrical equipment. An exemplary embodiment of the present invention may receive electromagnetic radiation and process the resulting signal. For example, signal processing in some embodiments of the present invention may be used to identify electromagnetic radiation having a particular characteristic. Exemplary embodiments may utilize a wide and flat passband filter to combat and eliminate the problem of standing waves. The use of a wide filter with a flat passband causes a cancellation effect among various frequencies within the passband when the EMI detector is not at the exact source. This results in a EMI detector that may be immune to the false source phenomenon that other EMI detectors experience. This allows exemplary embodiments to locate the disruption more efficiently. To aid with location of disruption, exemplary embodiments take readings at multiple frequencies and use an averaging technique to guide a user to the location. This averaging function may occur inherently as a function of the wide filter employed. Furthermore, an exemplary embodiment of the present invention may also include the determination of the time and/or location during testing. As a result, an exemplary embodiment of the present invention may be useful for stationary and/or mobile testing of an electrical system.

In addition to the novel features and advantages mentioned above, other features and advantages of the present invention will be readily apparent from the following descriptions of the drawings and exemplary embodiments.

BRIEF DESCRIPTION OF THE DRAWINGS

FIG. 5A is a first part of a schematic diagram illustrating an exemplary embodiment of a system of the present invention for detecting impaired electrical equipment.

DETAILED DESCRIPTION OF EXEMPLARY EMBODIMENT(S)

Figure 1:
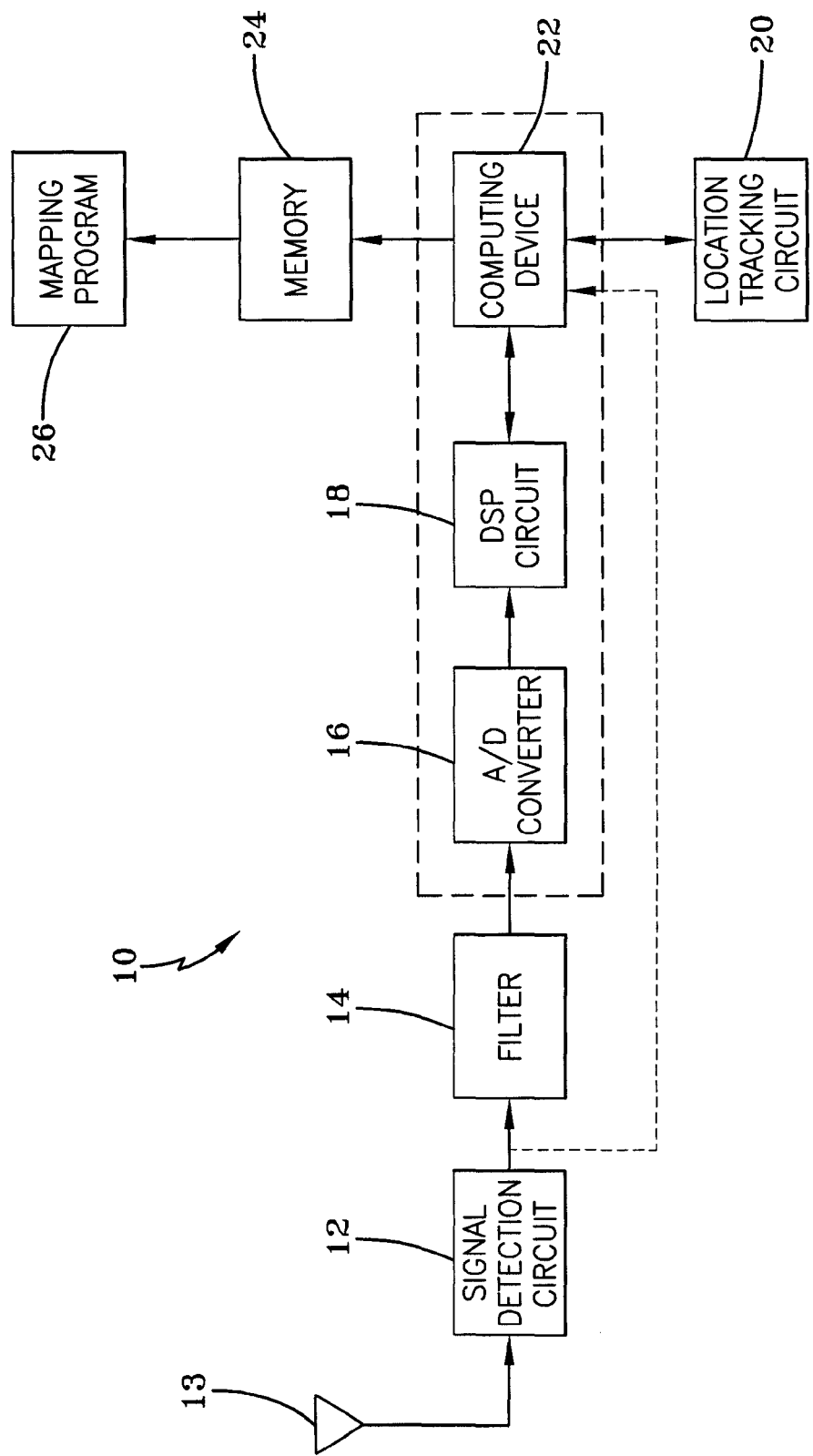
FIG. 1 is a block diagram of an exemplary embodiment of a system for detecting electromagnetic radiation of the present invention.

Exemplary embodiments of the present invention are directed to a system and method for detecting impaired electric power equipment. FIG. 1 illustrates one example of a system of the present invention. In FIG. 1, the system 10 is comprised of a signal detection circuit 12. Signal detection circuit 12 may be any device that is adapted to receive radio frequency electromagnetic radiation or radiation in another desired frequency range. The particular type of signal detection circuit 12 may be selected to detect electromagnetic radiation within a desired frequency range. For example, the signal detection circuit 12 of an exemplary embodiment of the present invention may be adapted to detect electromagnetic radiation in a frequency range outside of the normal operating frequency range of the energized electrical equipment to be tested. Furthermore, in some embodiments of the present invention, it may be desirable for the signal detection circuit 12 to detect electromagnetic radiation in a frequency range that does not overlap the operating band of other electrical systems, if possible. For example, when testing a power system, it may be desirable to detect electromagnetic radiation in a frequency range that does not include 60 Hz and that also does not overlap the frequency ranges of other electrical systems such as cable television systems, telecommunication systems, AM broadcast signals, CB radio signals, and other extensively populated frequency bands. For instance, an exemplary embodiment of the present invention may implement a signal detection circuit 12 that is adapted to detect electromagnetic radiation in the frequency range of 2-11 MHz in order to avoid the AM broadcast and CB radio frequency bands. An example of a commercially available signal detection circuit that is operable in the 2-11 MHz range is the Radar Engineers Model 246 demodulator. Another exemplary embodiment of the present invention may implement a signal detection circuit 12 that is adapted to detect electromagnetic radiation in the radio astronomy frequency range of 72-76 MHz, more preferably the 73-74.6 MHz portion of the RF spectrum primarily allocated for radio astronomy. By selecting a frequency band that is less populated, the present invention may facilitate the detection of electromagnetic radiation that is emitted from impaired electrical equipment (i.e., the possibility of confusion with electromagnetic radiation that is not caused by impaired electrical equipment is lessened). An exemplary embodiment of the signal detection circuit 12 may enable an operator to select an operating range that is most suitable for particular testing conditions. For example, an embodiment of the signal detection circuit 12 may include a switch or other selection mechanism that enables an operator to select a desired frequency range. For instance, one exemplary embodiment of the signal detection circuit 12 may enable the selection of multiple different frequency ranges between 5 MHz and 500 MHz. As a result, an operator may be enabled to select a frequency range that provides the best detection results (e.g., eliminates the most background noise). Furthermore, if it is desired to detect a particular type of impairment and the range of electromagnetic radiation that is emitted by that type of impairment is known, then a signal detection circuit may be selected that is adapted to detect electromagnetic radiation in that range. Nevertheless, it should be recognized that some embodiments of the present invention may detect electromagnetic radiation in any desired frequency range (e.g., a heavily populated frequency range or a frequency range that covers the normal operating frequency range of the energized electrical equipment to be tested). Moreover, some exemplary embodiments of the signal detection circuit 12 may detect electromagnetic radiation outside of the radio frequency range.

The signal detection circuit 12 may be in electrical communication with an antenna 13 that is adapted to receive electromagnetic radiation. An exemplary embodiment of the antenna 13 is not resonant within the operating frequency range of the electrical equipment that is being surveyed. The antenna 13 may also not be resonant within the operating frequency range of the signal detection circuit 12. Such an embodiment may enable the use of an antenna 13 of a size that is particularly suitable for mobile use of system 10. In one exemplary embodiment, the antenna 13 may be a ¼ wave mobile antenna sized for the 2-meter amateur radio band. It should be recognized that other shorter or longer antennas are available and suitable for use in the present invention. In addition to size, a non-resonant antenna 13 may also provide the benefit that the operation of the device is not dependent on whether the antenna is resonant with a desired frequency range. Another possible benefit is that a non-resonant, voltage sense antenna may lessen or eliminate variations in antenna gain, which could complicate the analysis of the electromagnetic signals. Nevertheless, certain embodiments of antenna 13 may be resonant within either or both of the aforementioned frequency ranges. It should also be recognized that a directional antenna may also be used in the present invention.

The signal detection circuit 12 is adapted to produce an output that bears a relationship to the detected electromagnetic radiation. Unless expressly set forth, the relationship of the output to the detected electromagnetic radiation is not limited. One exemplary embodiment of the signal detection circuit 12 may produce an analog output that is proportional to the level of detected electromagnetic radiation. For example, the analog output may have a proportional voltage and/or frequency. For instance, an exemplary embodiment of signal detection circuit 12 that detects electromagnetic radiation in the 2-11 MHz range may produce an audio frequency output that is proportional to the level of detected electromagnetic radiation. It should also be recognized that some exemplary embodiments of the signal detection circuit 12 may produce a digital output that bears a relationship to the level of detected electromagnetic radiation (e.g., an output that is proportional to the modulation of detected electromagnetic radiation).

The signal detection circuit 12 may be in electrical communication with an optional filter 14. In particular, the filter 14 may be adapted to receive the output of the signal detection circuit 12. An exemplary embodiment of the filter 14 may be a band pass filter. For example, a band pass filter may be used to limit aliasing of an analog output of the signal detection circuit during subsequent conversion into a digital signal for further processing. One exemplary embodiment of a band pass filter is a fast roll-off filter such as a switched capacitor $8^{th}$ order band pass filter (e.g., MAX293) with 3 dB cutoff frequencies set to 2 kHz. Such an embodiment results in at least about 80 dB attenuation at approximately 3 kHz. Nevertheless, it should be recognized that the particular characteristics of the filter 14 may be selected in order to suit the output of the signal detection circuit 12 and the rate of digital sampling. For example, if the digital sampling rate is 7680 samples per second, a band pass filter may be selected to prevent aliasing of frequencies above the Nyquist frequency of 3840 Hz.

An analog-to-digital (A/D) converter 16 may be in electrical communication with the filter 14. In an exemplary embodiment in which the outputs of the signal detection circuit 12 and the optional filter 14 are analog, the A/D converter may be adapted to sample the analog output and convert it into a digital signal. The rate of sampling may be selected to achieve accurate A/D conversion, which may take the rate of travel into account if the system 10 is used for mobile testing. For example, an A/D converter 16 may sample at a rate of 7680 samples per second (e.g., 128 samples per each 60 Hz cycle) in one exemplary embodiment of a system 10 that is adapted for mobile testing of a power system (e.g., a power line).

A digital signal processing (DSP) circuit 18 is adapted to receive the digital signal produced by A/D converter 16. Examples of a digital signal processing circuit 18 include, but are not limited to, the Texas Instruments TMS320 series of digital signal processors, other mixed signal processors, and other similar or suitable processors. The digital signal processing circuit may be adapted to receive digital signals and identify a modulation component associated with spiking and having a frequency component within a predetermined frequency band. An exemplary embodiment of the digital signal processing circuit 18 may function as a digital filter. Examples of digital filters include infinite impulse response filters (IIRs) and finite impulse response filters (FIRs). An exemplary embodiment of a finite impulse response filter may implement a Fourier transform (e.g., a fast Fourier transform or a discrete Fourier transform) to identify a particular component of the digital signal. For example, a discrete Fourier transform may be used to identify a component of the digital signal having a modulation frequency within a predetermined band and frequency.

Figure 2:
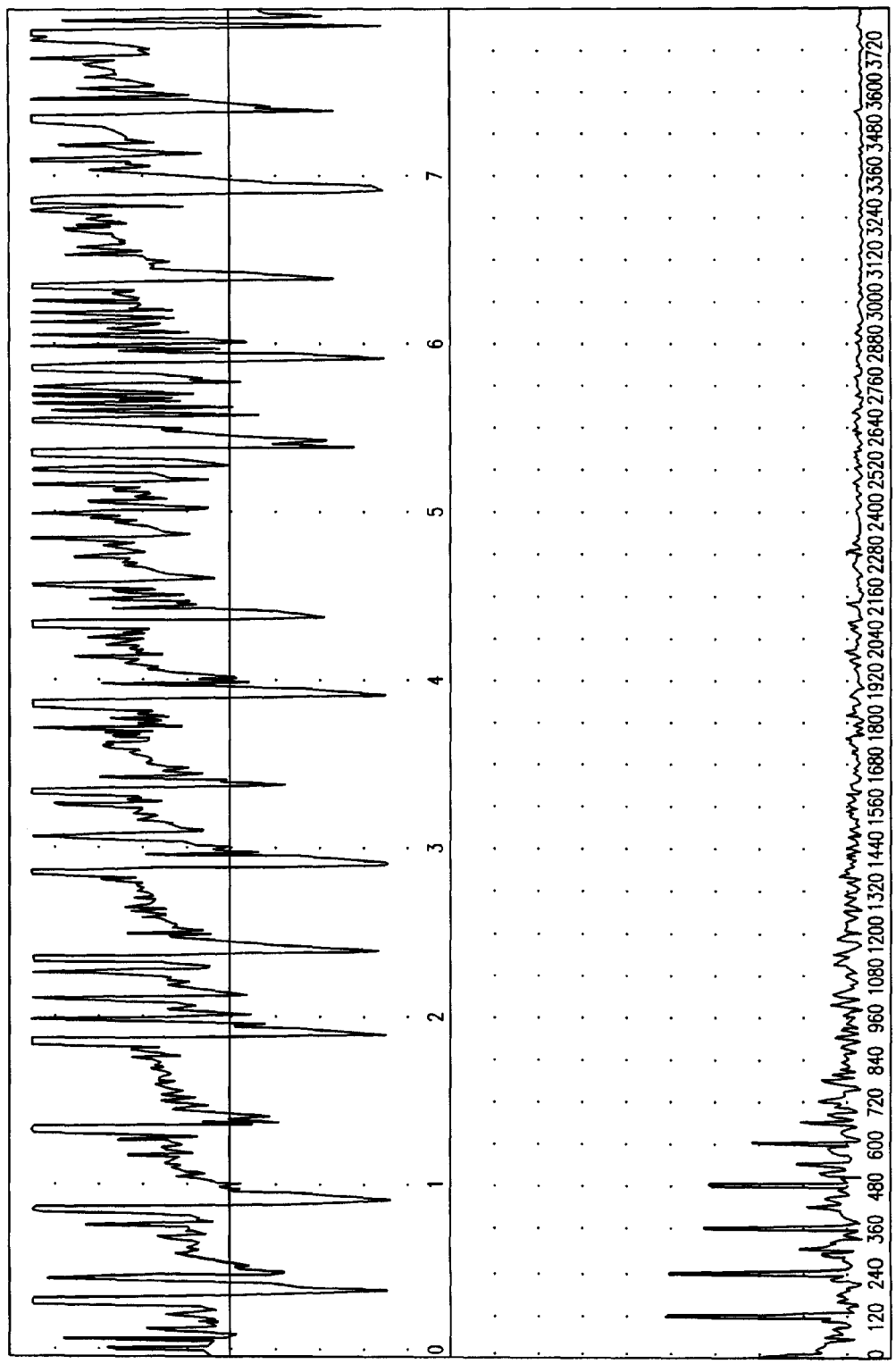
FIG. 2 is a graph of an exemplary embodiment of the modulation of a waveform.

A power system in the United States typically operates at 60 Hz. As a result, there is a peak in the voltage signal every half cycle. In the case in which there is impaired equipment in a power system, arcing commonly occurs when the voltage signal approaches its positive and negative peaks. In other words, a charge may build up and jump across an impaired area one or more times approximately around each peak of the voltage signal. The number of arcs per unit time is the pulse repetition rate. The beginning and end of the arcing around each peak is a function of factors such as the voltage and the size of the gap. Moreover, the frequency of the discharge signal (i.e., the RF frequency) typically varies based on the particular characteristics of the impaired equipment. Nevertheless, a modulation frequency of the electromagnetic radiation caused by the arcing is approximately 120 Hz since the arcing occurs around every positive and negative peak of the voltage signal. FIG. 2 shows an example of a waveform having 120 Hz modulation. Thus, when testing an electrical system that operates at 60 Hz, the digital signal processing circuit may be used to identify and isolate a component of the electromagnetic radiation that has a modulation frequency of approximately 120 Hz. For example, the digital signal processing circuit may identify a component having a modulation frequency in a predetermined band that includes 120 Hz modulation (e.g., 115-125 Hz). Of course, if testing electrical equipment that operates at a frequency other than 60 Hz, the same principles may still apply. For example, a modulation frequency of arcing on the 50 Hz power grid in Europe is 100 Hz. In other words, the primary modulation frequency of the arcing is the second harmonic frequency of the fundamental frequency of the transmitted signal (i.e., the fundamental frequency of the signal source). In light of these characteristics of arcing, an exemplary embodiment of the digital signal processing circuit 18 may be used to identify a signal component having the primary modulation frequency (e.g., 120 Hz in the United States or 100 Hz in Europe). In fact, it should be noted that a 60 Hz modulation component may also be significant in the United States, and it should be recognized that a 50 Hz modulation component may also be significant in Europe. As a result, an exemplary embodiment of the digital signal processing circuit 18 may be used to identify a component having a modulation frequency that is equivalent to the fundamental frequency of the signal source (e.g., 60 Hz in the United States or 50 Hz in Europe) or any of the harmonics thereof for the purpose of identifying arcing caused by a power system. Thus, in the United States for example, harmonics above 120 Hz may also be useful. Although we have discussed the invention primarily with regard to the power systems in the United States and Europe, it should be recognized that the same principles are applicable to other types of power systems that have different fundamental frequencies.

Some exemplary embodiments of the digital signal processing circuit 18 may also perform other functions. For example, the digital signal processing circuit may be adapted to determine the mean value (RMS) and peak value of the electromagnetic radiation in real time. The digital signal processing circuit may also be adapted to determine the standard deviation and level of background noise in real time. Alternatively, a predetermined background level may be provided to the digital signal processing circuit. Such information can be used to improve the accuracy of locating impaired equipment. However, it should be recognized that such calculations may be made later using stored data in some other embodiments of the present invention.

Some exemplary embodiments of the digital signal processing circuit 18 may be dynamically changed to adjust to specific survey conditions. As a result, a different unit may not be required for each different type of test. For example, hardware may not have to be replaced in order to adjust to specific testing conditions.

A location tracking circuit 20 may be included in the system 10. The location tracking circuit 20 may be any device that is adapted to receive data regarding the location of system 10. An example of a location tracking circuit 20 is a global positioning system (GPS) circuit that may be adapted to automatically track the location of the system 10 by recording geographic coordinates. The refresh rate of the GPS circuit may be selected to achieve the desired accuracy, which may take the rate of travel of system 10 into account. For example, an exemplary embodiment of a GPS circuit may take a measurement once every second. In such an embodiment, if the system 10 travels in a vehicle moving at 60 miles per hour, the GPS circuit would take a measurement every 88 feet. Another exemplary embodiment of a GPS circuit may take 100 measurements every second. A different operating mode may be to only take a measurement when the level of detected electromagnetic radiation exceeds a predetermined value. It should also be recognized that a GPS circuit may also be adapted to automatically determine the time in some exemplary embodiments of the present invention. Exemplary embodiments of GPS circuits include, but are not limited to, the Motorola M12+ TIMING ONCORE RECEIVER and other similar or suitable GPS circuits.

A computing device 22 may be in electrical communication with the digital signal processing circuit 18 and the location tracking circuit 20. The computing device 22 may be any device that is adapted to correlate the output (e.g., the component signal having predetermined modulation, the peak value, the mean value, the standard deviation, and/or the background noise level) of the digital signal processing circuit 18 with the location data provided by the location tracking circuit 20. Examples of computing devices include, but are not limited to, microprocessors and microcontrollers. As a result, the computing device 22 may be adapted to identify or determine the level of a particular component of electromagnetic radiation at a particular location. Thus, if the level of a particular component of electromagnetic radiation is relatively or uncharacteristically high in a particular location without a legitimate reason, a location of impaired electric power equipment may have been detected. Moreover, some exemplary embodiments of the computing device 22 may be adapted to identify the particular type of impaired equipment. For example, some embodiments of the computing device 22 may be programmed to identify the particular type of impaired equipment based on the frequency and/or voltage and/or modulation characteristics of the detected electromagnetic radiation. For instance, if it is known that a cracked insulator emits electromagnetic radiation having a particular frequency and/or voltage and/or modulation, the computing device 22 may be programmed to identify that measurement as indicative of a cracked insulator. The same type of process could also be performed for any type of electrical component including, but not limited to, arresters, insulators, cutouts, utility pole hardware, and other types of electrical components. In addition, some exemplary embodiments of the computing device 22 may be adapted to compare the mean value and peak value of the electromagnetic radiation to the level of background noise using data provided by digital signal processing circuit 18. The computing device 22 may use this data to determine if the background noise is causing a false indication of impaired equipment. In other words, the computing device 22 may use this data to determine if the background noise is causing a false indication that there is a relatively or uncharacteristically high level of electromagnetic radiation. One exemplary embodiment of the computing device 22 may compare this data in decibels (dB).

In FIG. 1, analog-to-digital converter 16, digital signal processing circuit 18, and computing device 22 are shown as separate devices to more clearly show the invention. Nevertheless, it should be recognized that the computing device 22 may be comprised of an analog-to-digital converter 16 and a digital signal processing circuit 18 in exemplary embodiments of the present invention. In other words, analog-to-digital converter 16, digital signal processing circuit 18, and computing device 22 may be embodied in a single device or in multiple devices in the present invention. The digital signal processing circuit may be adapted to receive digital signals and identify a modulation component associated with spiking and having a frequency component within a predetermined frequency band.

The system 10 may also include an optional memory device 24. Examples of memory devices include, but are not limited to, multimedia cards (MMCs) (e.g., a 64 MB MMC), compact flash cards, secure digital cards, PROM, EPROM, EEPROM, and other similar or suitable types of memory. The memory device 24 may be in electrical communication with the computing device 22. For example, the memory device 24 may be in serial or parallel communication with the computing device 22. In one exemplary embodiment, the system 10 may include a socket for receiving memory device 24. For example, a MMC may include a backing with a thumb hole to enable it to be easily removed from the socket. Alternatively, an exemplary embodiment of memory device 24 may have a wired or wireless connection to system 10. For instance, there may be a radio link or other type of communication link between computing device 22 and memory device 24 (e.g., memory device 24 may be located at a remote base station) to facilitate the storage of data. In an exemplary embodiment, the memory device 24 may be adapted to store the data concerning the output of the digital signal processing circuit 18, the time, and the location data provided by the location tracking circuit 20. As a result, the memory device 24 may be particularly useful for mobile testing by system 10. For example, the memory device 24 may automatically record data as the system 10 is continuously or intermittently moved during a survey of electrical equipment. For instance, one exemplary embodiment of the memory device 24 may record data about once every second during one exemplary mode of operation. As a result, a skilled technician is not required to analyze the data as it is being determined by the system. Instead, the data may be recorded during routine field work such as revenue meter reading, for example. At a later time, the stored data may be retrieved and analyzed (e.g., using a map) to determine if there is impaired equipment somewhere out in the field.

The system 10 may include a mode in which an exemplary embodiment of the memory device 24 may be controlled to capture a waveform of electromagnetic radiation in addition to the other data. For example, the memory device 24 may be adapted to capture a waveform of the electromagnetic radiation modulation when there is a transition from a low level signal to a high level signal. In other words, there may be an analog input from the signal detection circuit 12 to the computing device 22, which may initiate the storage of the waveform on the memory device 24. This enables an operator to play the waveform back and listen to it. By listening to the audio signature, an operator may be able to identify the source of the electromagnetic radiation because each type of impairment may have a characteristic audio signature. For example, a waveform capture of about 1 to 2 seconds or longer may enable an operator to identify the type of impairment. In the meantime, an exemplary embodiment of the memory device 24 may be programmed to not capture another waveform until the system 10 has traveled at least 200 feet or another desired distance from the position of the previous waveform capture. Thus, if the vehicle is stopped, such an embodiment of the memory device 24 may not make another waveform capture until the vehicle is 200 feet or another desired distance away from the location of the previous waveform capture. In such an embodiment, driving in a circle would not necessarily move the vehicle the desired distance away from the location of the previous waveform capture; therefore, memory device 24 may also be set to capture a waveform based on a desired time interval (e.g., every 10 minutes). Such a setup may be particularly useful in stationary or cable vault applications of the present invention, for example.

The operation of an exemplary embodiment of the memory device 24 will now be described. An exemplary embodiment of the memory device 24 may automatically record time, location, and signal strength data in one block or portion of memory. For example, signal strength data may include the amount of 120 Hz modulation (e.g., the mean and/or peak) for about each second or another desired time interval in an exemplary embodiment of the present invention. As discussed below, an exemplary embodiment of a mapping and analysis program may be used to create a map using the location data and the 120 Hz modulation peak data from this block or portion of memory. Another block or portion of memory may automatically record time and waveform data. As previously mentioned, the waveform data may be used to look with more detail at a particular location. An exemplary embodiment of a mapping and analysis program may read both blocks of memory and match up the data by looking for data with a common time stamp. As a result, the waveform data may be used to look with more detail at a particular impairment. Such an embodiment of the memory device 24 may be particularly useful for the purposes of the present invention. Nevertheless, it should be recognized that certain embodiments may utilize more or less data and may store and access it in a different way in order to detect impaired electrical equipment utilizing the principles of the present invention.

Figure 3:
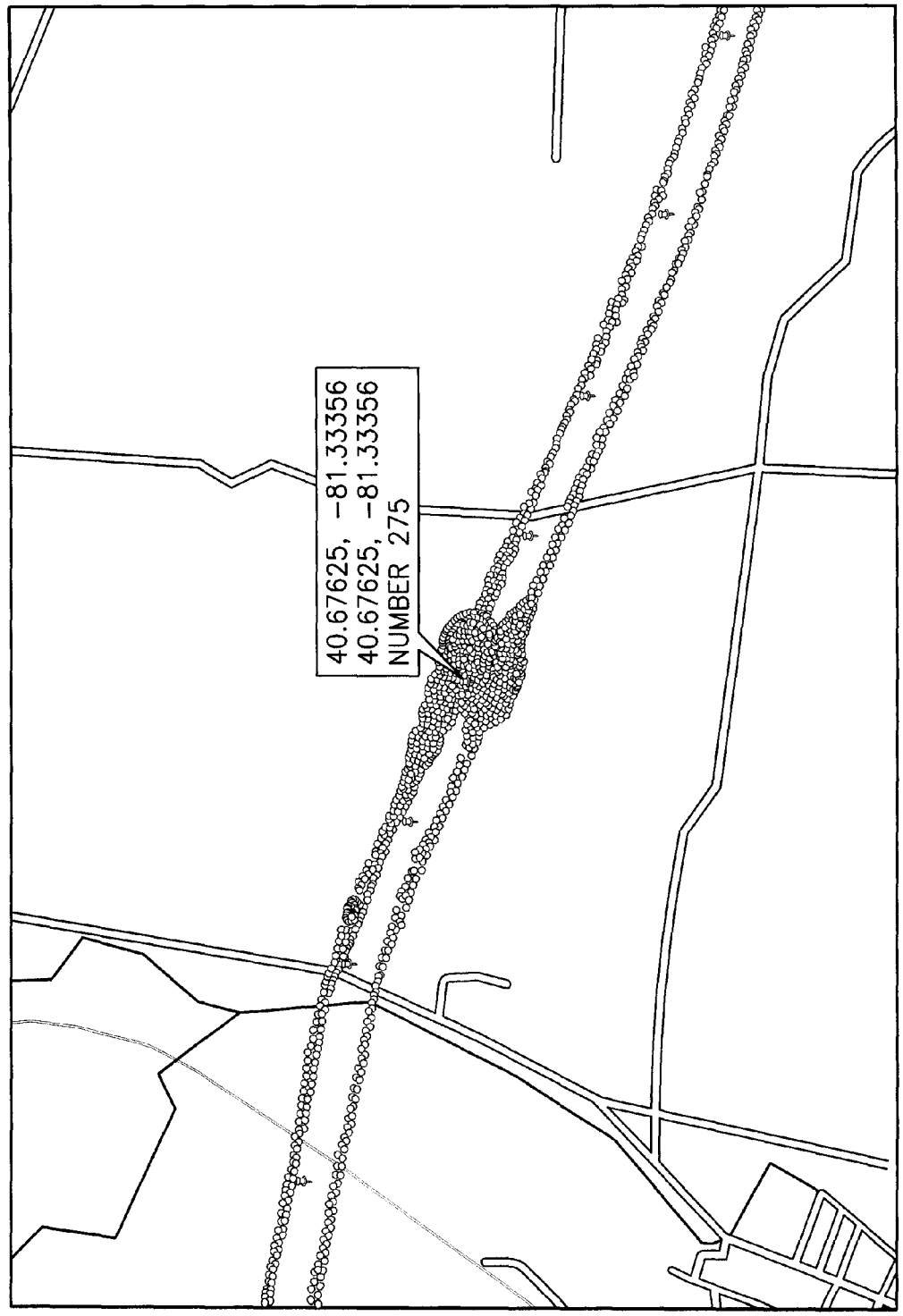
FIG. 3 is an example of a map showing a high level of electromagnetic radiation that is indicative of impaired electrical equipment.

As mentioned above, an optional mapping (and/or analysis) program 26 may also be included in the system 10. The mapping program 26 may be an integral or remote component of the system 10. For example, the mapping program 26 may have a wired or wireless connection to the system 10. For another example, the mapping program 26 may be adapted to receive the data from memory device 24 without the benefit of a wired or wireless connection to the system 10, such as by receiving a memory card. Regardless of the particular type of system architecture, the mapping program 26 may receive the data produced by computing device 22. The mapping program 26 may then produce a map that illustrates the level of electromagnetic signal strength at predetermined locations. For instance, the mapping program 26 may produce a map showing the levels of a particular component of electromagnetic radiation that is generated by electrical equipment along a surveyed route. FIG. 3 is an example of a map that shows a high level of electromagnetic radiation caused by a power line as observed by an exemplary device of the present invention mounted in an inspection helicopter.

An exemplary embodiment of system 10 may be used to test a variety of electrical systems. For example, an exemplary embodiment of the system 10 may be used to survey a power system including, but not limited to, at least one power line along a particular route. For instance, the signal detection circuit 12 and the location tracking circuit 20 may be provided in a vehicle. An antenna for the signal detection circuit 12 may also be provided in the vehicle. In other words, circuits 10 and 12 and the antenna may be provided anywhere in the interior or exterior of the vehicle. Examples of a vehicle include, but are not limited to, automobiles (e.g., cars, trucks, and vans), trains, airplanes, helicopters, boats, and any other type of mechanized equipment that may be used to transport something. The vehicle may travel in a path in the vicinity of the electrical equipment. The distance from the electrical equipment may be any suitable distance. A suitable distance may be a function of the sensitivity of the signal detection circuit and the location of the equipment being tested in relation to other sources of electromagnetic radiation. In one exemplary embodiment of the present invention, the vehicle may be anywhere within 200 feet of the electrical equipment. In other embodiments of the present invention, the vehicle may be further than 200 feet from the electrical equipment. While the vehicle is moving in the path of the electrical equipment, the system 10 may simultaneously detect electromagnetic radiation and receive location data. A digital signal may be derived from the detected electromagnetic radiation such as previously described. Furthermore, a digital signal processing circuit 18 may be provided in the vehicle for processing the digital signal and identifying a component associated with spiking and having a modulation frequency within a predetermined band. Thereafter, a computing device 22 may be used to control the creation of a map or any other type of graphical or textual representation of the component and the location data. These functions may all occur while the vehicle is moving in the vicinity of the electrical equipment or at a later time. For example, these functions may be automatically performed while an electrical worker is simply riding in the vehicle in the normal course of his or her job. As another example, the data (e.g., time, longitude, latitude, the level of detected electromagnetic radiation, and/or other data) may be automatically stored for subsequent use in some exemplary embodiments of the invention. If the mapping program is not provided in the vehicle, a map may be created at a later time using the stored data. For example, a map may be created to show the levels of electromagnetic radiation produced by the electrical equipment (e.g., a power line) that was surveyed.

Figure 4:
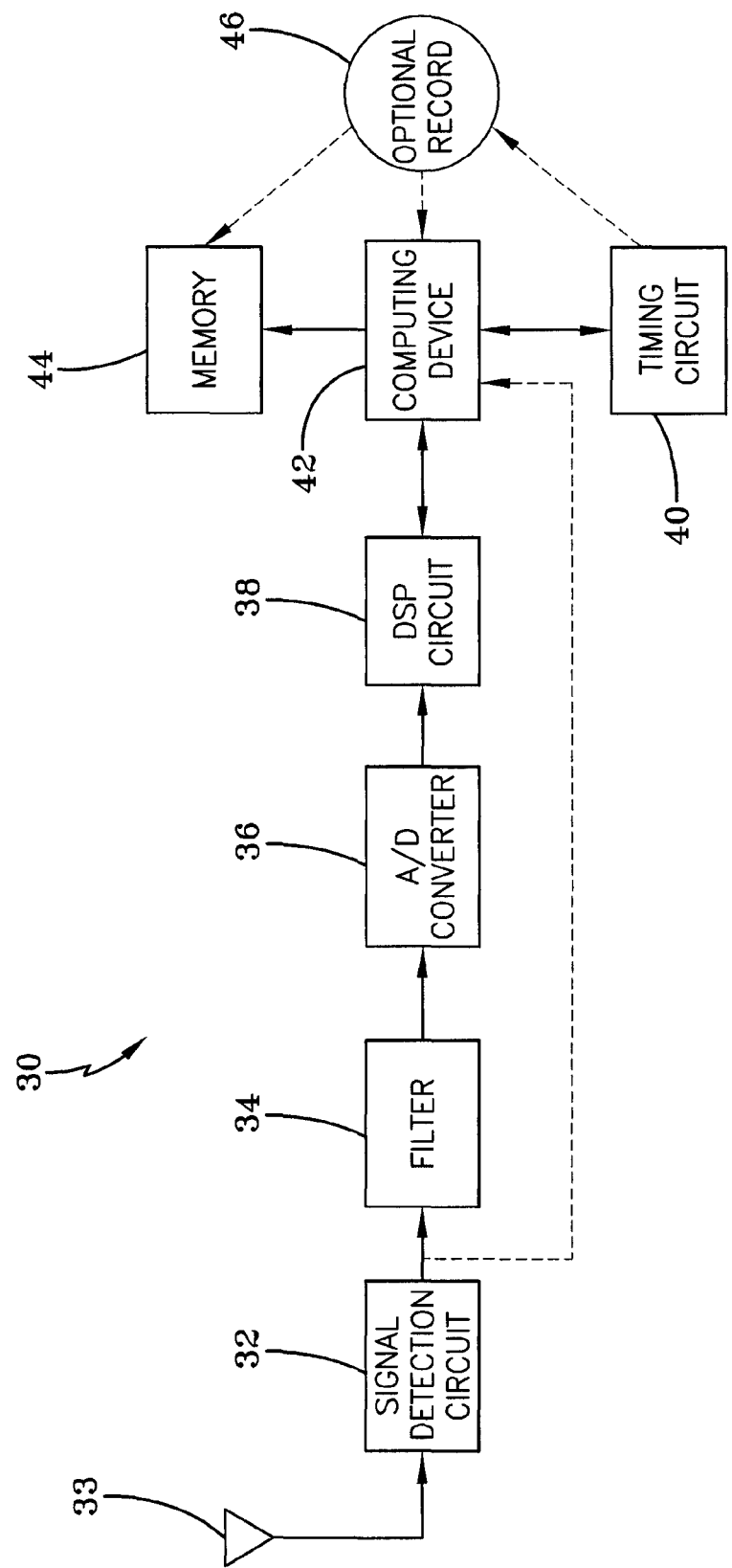
FIG. 4 is a block diagram of a second exemplary embodiment of a system for detecting impaired electrical equipment of the present invention.
Figure 5B:
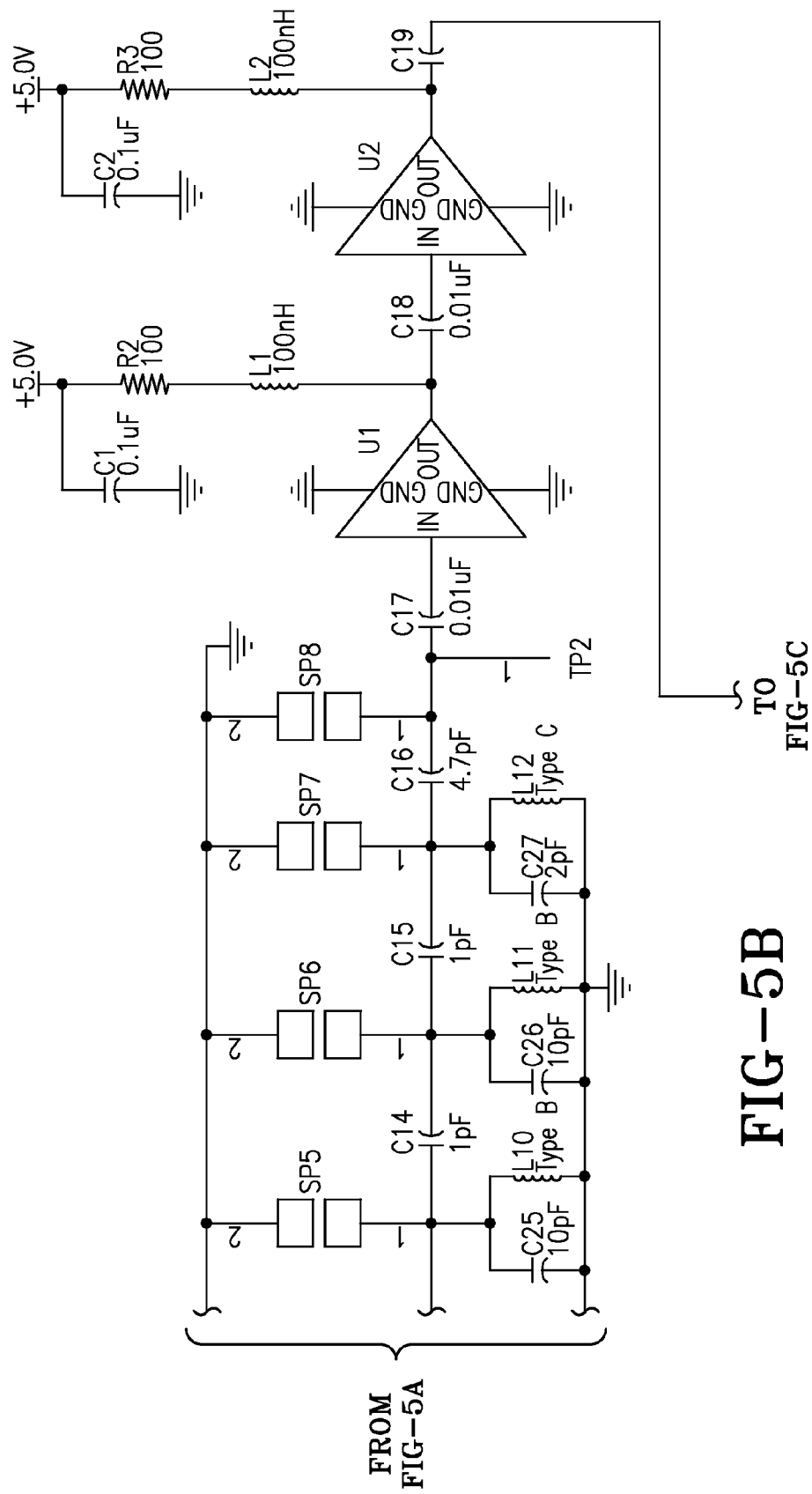
FIG. 5B is a second part of a schematic diagram illustrating an exemplary embodiment of a system of the present invention for detecting impaired electrical equipment.
Figure 5C:
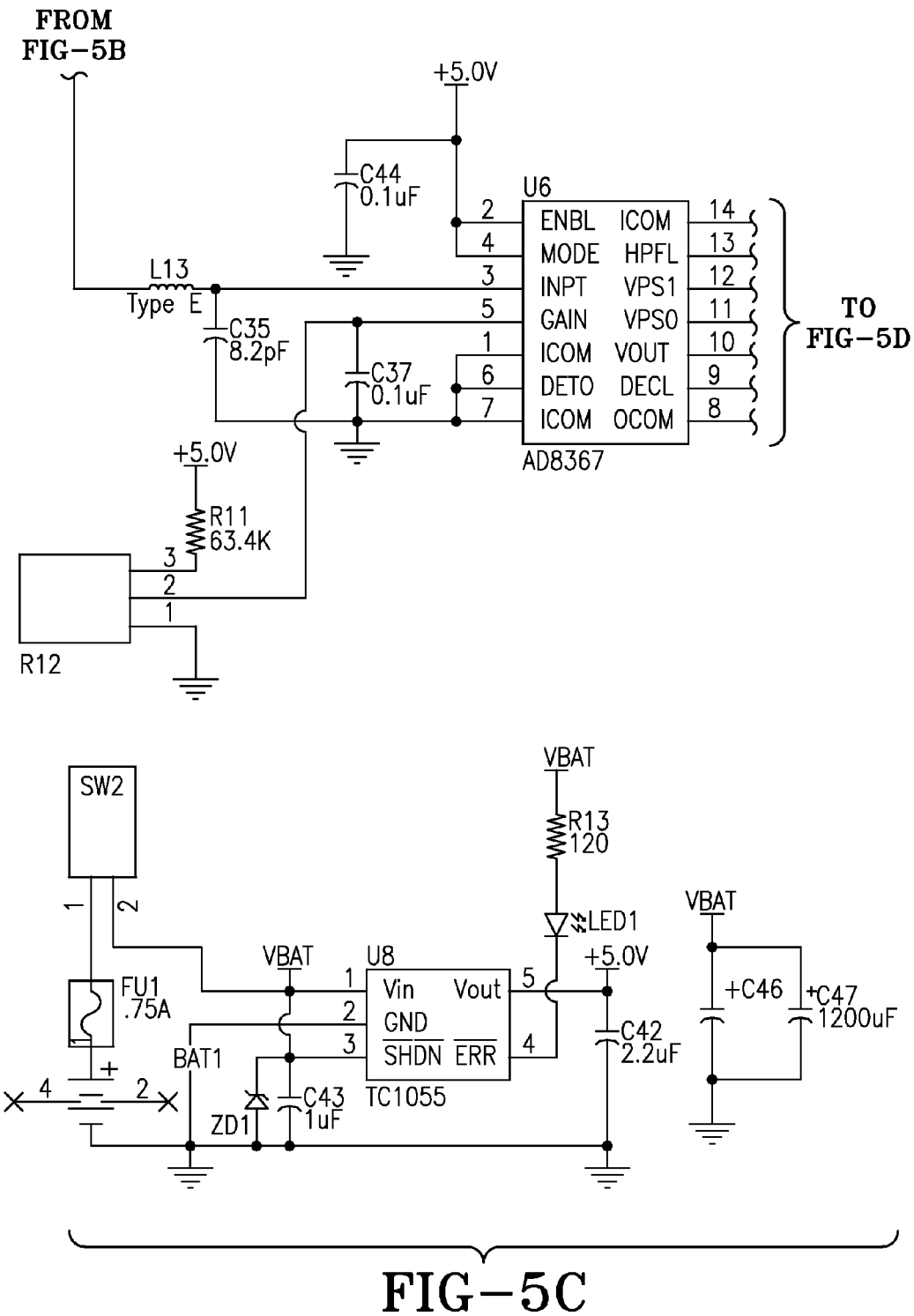
FIG. 5C is a third part of a schematic diagram illustrating an exemplary embodiment of a system of the present invention for detecting impaired electrical equipment.
Figure 5D:
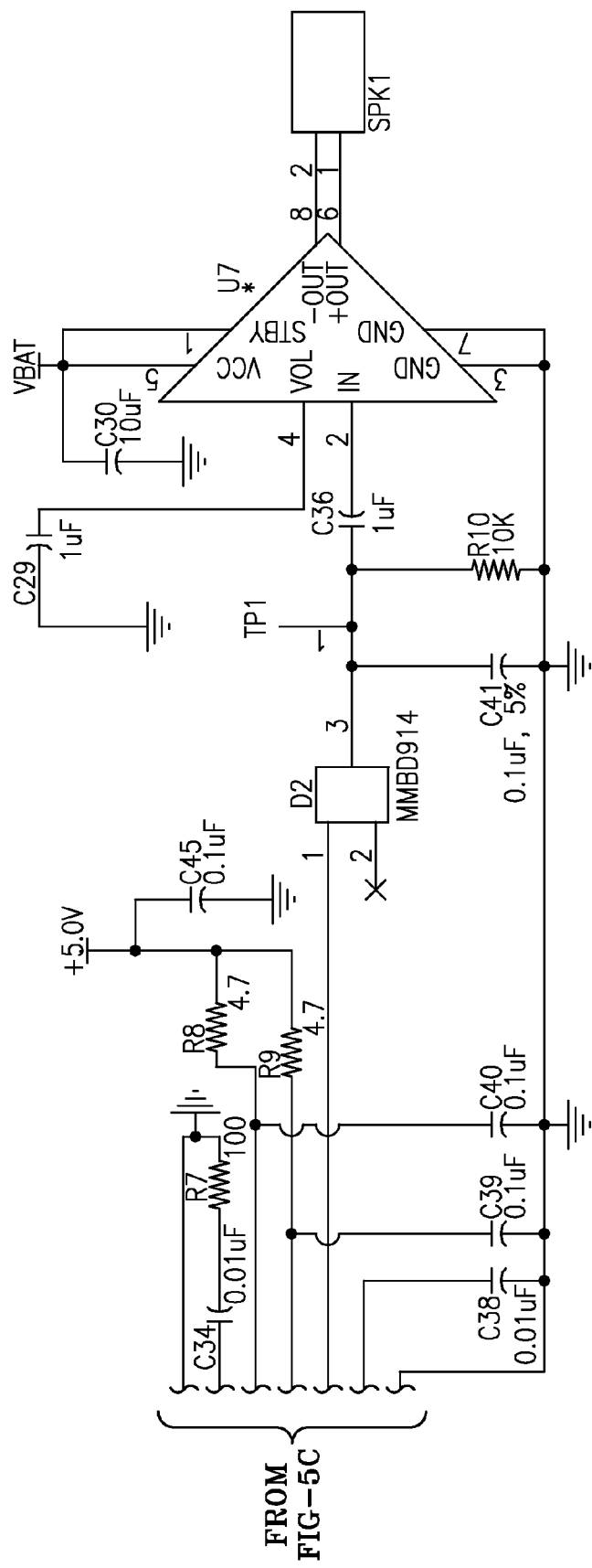
FIG. 5D is a fourth part of a schematic diagram illustrating an exemplary embodiment of a system of the present invention for detecting impaired electrical equipment.

FIG. 4 illustrates another exemplary system of the present invention. In this example, the system 30 is also comprised of a signal detection circuit 32, an optional antenna 33, a filter 34, an A/D converter 36, a digital signal processing circuit 38, a computing device 42, and an optional memory device 44. With regard to these components, the operation of system 30 may be similar to the operation of system 10. The digital signal processing circuit may be adapted to receive digital signals and identify a modulation component associated with spiking and having a frequency component within a predetermined frequency band. However, the system 30 includes a timing circuit 40. Timing circuit 40 may be any type of device that is adapted to determine time data. As previously mentioned, a GPS circuit is one example of a timing circuit 40. An internal clock is another example of a timing circuit 40. The system 30 may simultaneously determine the time data while detecting the electromagnetic radiation in an exemplary embodiment of the invention. The Motorola M12+ TIMING ONCORE RECEIVER is an example of timing circuit that provides a high degree of accuracy (e.g., 10 ns) which may be desirable for an exemplary embodiment of system 30 that requires precise timing. Computing device 42 is in electrical communication with digital signal processing circuit 38 and timing circuit 40. In this exemplary embodiment, the computing device 42 is adapted to correlate the output of digital signal processing circuit 38 with the time data provided by timing circuit 40. Furthermore, an exemplary embodiment of the computing device 42 may be adapted to use angle of arrival calculations to further identify the location of impaired equipment. The optional memory device 44 may be used to store data related to the output of digital signal processing circuit 38 and time data provided by timing circuit 40.

The system 30 may also include an optional operational record 46. Operational record 46 may be any electronic or hard copy (e.g., paper) record that correlates the operation of electrical equipment with time data. For example, the operational record 46 may be a static record that does not require updating (e.g., if the electrical equipment always performs the same operation at the same time) or a fluid record that requires updating (e.g., automatic updating) to reflect the operational status of the electrical equipment. One example of an operational record 46 is a sequence of events log. The time data may be provided by timing circuit 40 or another source. If operational record 46 is in electronic form, the operational record may be provided to computing device 42 in order to correlate the operation of electrical equipment with the output of digital signal processing circuit 38. Furthermore, the operational record 46 may be stored in memory 44 for subsequent analysis. On the other hand, if the operational record 46 is a hard copy, a system operator may visually compare the operational record 46 with the data determined by computing device 42. In any of these cases, impaired electrical equipment may be detected by checking the status of each piece of electrical equipment at the time of a relatively or uncharacteristically high level of electromagnetic radiation. In light of these features, the system 30 may be particularly useful for stationary testing of electrical equipment. Nevertheless, it should be recognized that system 30 may also be useful for other types of testing including, but not limited to, testing that involves limited movement.

Another exemplary embodiment of the present invention may combine the features of system 10 and system 30. In particular, this exemplary embodiment may include a location tracking circuit as well as a timing circuit. In addition, this exemplary embodiment may also include an operational record. As a result, this exemplary embodiment of the invention may be particularly well suited for stationary and mobile testing.

FIGS. 5A-5D illustrate another exemplary embodiment of a detection circuit 50. This exemplary embodiment may provide improved detection of impaired equipment such as by substantially eliminating or limiting false sources. In this example, circuit 50 may include an antenna 52 that may be in electrical communication with at least one diode 54 (e.g., a pair of diodes as shown in this embodiment). In some embodiments, the antenna 52 may be tuned to about 144 MHz. In some embodiments, the antenna is in range of a broadband signal. The antenna may be a two part antenna using high frequency. In other embodiments, a frequency of about 100 MHz may be used to decrease the problem of corona-induced emissions. As used herein, electrical communication shall not be limited to a direct electrical connection; intermediate components may be provided between the items that are in electrical communication. If multiple diodes 54 are provided, the diodes 54 may be connected in series such as in this example. In one exemplary embodiment, diode(s) 54 may serve to protect the circuit from damage that could be caused by a power distribution line. Circuit 50 may also include a filter 56 in electrical communication with antenna 52. The filter 56 may have a flat response and a wide passband. In some exemplary embodiments the passband may have a width of about 10 MHz, although it should be recognized that passband may be wider. The filter 56 may also have a steep 20 dB roll off per decade. In this example, filter 56 is an analog $8^{th}$ order band pass filter comprising inductor-capacitor pairs. In other embodiments, the filter 56 may be a ceramic filter, saw filter, crystal filter, inductor-capacitor filter, or any other suitable filter. One desirable characteristic of such an exemplary filter arrangement is steep cut-out of signal outside the frequency band of interest, which advantageously suppresses unwanted nuisance signals and/or noise. The use of a steep cut-off provides the EMI detector the ability to reject nearby intentional radio transmitters. Other exemplary embodiments may include a different order filter suitable for a particular application. In one embodiment, the analog filter is adapted to pass signals having frequencies in the range of about 130 MHz to about 170 MHz and more preferably in the range of about 145 MHz to about 155 MHz (e.g., about 147 MHz). Such frequency ranges may be outside of corona-induced electrical emissions and hence help to reduce the detection of corona-induced emission noise. At least one amplifier stage 58 may be in electrical communication with filter 56. In this example, there are two stages of amplification 58, each providing about 20 dB gain (i.e., 40 dB gain total). The at least one amplifier stage may comprise RF amplifier(s). At least one switch 60 (e.g., a wideband analog switch) may be in electrical communication with amplifier stage(s) 58. In this exemplary embodiment, two switches 60 are provided for high isolation and low insertion loss. A variable gain amplifier 62 may be in electrical communication with switch(es) 60, wherein variable gain amplifier 62 may be adapted to provide linear gain control. More particularly, this exemplary embodiment may provide approximately 0 to 45 dB range (e.g., −10 dB to 30 dB). In other exemplary embodiments, a pair of switches 60 may be used. The switch pair may be IF switch ICS. Multiple paths may be located between the pair of switches. The first path may be 20 dB attenuated and the second path may be a straight path. In this manner, it allows for path selection. In other embodiments there may be no attenuation for higher signals wherein at least one switch is SWI. A potentiometer 64 may be provided for controlling the gain of variable gain amplifier 62. In one exemplary embodiment, the potentiometer may be provided on an enclosure for circuit 50 for easy access and adjustability. The variable gain amplifier 62 may be wired to the potentiometer 64 to allow adjustment of the RF signals. A switching diode 66 may be in electrical communication with variable gain amplifier 62 for switching in response to a suitable signal. A diode detector circuit may also be included. The diode detector circuit may sum the amounts of the RF energies. The switching diode 66 may be adapted to control an audio amplification stage 68 in order to indicate detection of a source of electromagnetic radiation having the desired characteristics. Optionally, a visible indication such as an LED or any other type of light may be provided to indicate detection of a source of electromagnetic radiation having the desired characteristics. In other embodiments, a wireless transmitter may be used in conjunction with the detection circuit 50. A receiver may also be used and attached to the user's person, such as attached to a belt. The wireless transmitter may send a signal to the receiver and the receiver may store the information for later retrieval.

Exemplary embodiments of the present invention may also include other features. For example, an analog or digital squelch filter may be provided before, by, or after the digital signal processing circuit. An exemplary embodiment of a squelch filter may be provided by the digital signal processing circuit and may be used to filter out background noise and/or low level signals that are not indicative of impaired electrical equipment. Such an embodiment may be particularly useful if there is an audible signal that indicates the level of electromagnetic radiation. For instance, an exemplary embodiment of the EMI device as described herein may be used in tandem with other detection techniques such as acoustics to create a more comprehensive equipment health monitor. One example is a generator step up (GSU) equipment health monitor wherein the EMI device may be combined with an acoustics system and/or another suitable system for monitoring dissolved, combustible gases (e.g., Hydran for $H_2$) in order to more comprehensively monitor the status of the transformer equipment. Furthermore, for underground, stationary applications of the present invention, it should be recognized that a GPS circuit or other circuitry of the present invention may optionally be located in a manhole cover or in another suitable location in order to facilitate signal reception.

An exemplary embodiment of the system of the present invention may also include a hand-held testing unit (e.g., a hotstick). For example, a signal detection circuit may be provided in a hand-held unit to facilitate up close testing of a particular location. Such a circuit may be the only signal detection circuit, or there may be multiple signal detection circuits. If desired, a switch or other selection mechanism may be provided to select between multiple signal detection circuits.

For another example, the digital signal processing circuit and/or the computing device may be in electrical communication with a speaker. In other words, an exemplary embodiment of the present invention may produce an audible sound that varies with the level and/or frequency of the detected electromagnetic radiation. Similarly, an exemplary embodiment of the present invention may provide a visual indicator that is indicative of the level of detected electromagnetic radiation. For example, the digital signal processing circuit and/or the computing device may be in electrical communication with an LED or LEDs that turn on or change colors based on the level of detected electromagnetic radiation. In one exemplary embodiment of the present invention, a 0.125 inch phone jack may be used to place an LED in electrical communication with the system (e.g., the computing device). The LED may be placed in view of an operator of the system (e.g., a vehicle operator) to provide a real time indication of the level of electromagnetic radiation. For example, the LED may be a multi-color LED, wherein each color represents a different status of the system. Exemplary embodiments of the present invention may also include other types of visual displays including, but not limited to, graphic displays and text displays. For example, visual displays may be in communication with the computing device.

It should be recognized that a system of the present invention may be provided as a single unit or as multiple units. Furthermore, exemplary embodiments of the present invention may operate on batteries, by connection to an electrical outlet, or both. For example, one embodiment of a system of the present invention may be powered by a vehicle battery or another type of battery. A vehicle electrical system is another example of a suitable power source. It should also be recognized that power may be provided by inductive pickup from the equipment (e.g., a power line) to be monitored. For example, inductive power may be particularly useful in underground applications of the present invention such as cable vault monitoring.

EXAMPLES

One exemplary embodiment of a system of the present invention is a versatile tool for identifying the source of electromagnetic interference that may be used in different ways such as described below:
1. In one example, a system may be used to evaluate a utility pole from the ground. For instance, when patrolling for EMI, the results may not clearly point to a single pole. In this case, an exemplary embodiment of a system may help to determine which pole(s) actually contain EMI sources.
2. Use an EMI patrolling method (such as an exemplary system of the present invention that is transported by a vehicle) to find the general location of the strongest EMI level for a given area.
3. Begin by setting the exemplary system's attenuation switch to 0 db and gain control to 10. Approach the pole nearest to the maximum signal location identified in step 1.
4. Position the antenna of the exemplary system against the wood of the pole or against the pole ground. If a strong signal is detected, turn down the gain control until the sound produced is relatively quiet. The attenuation switch may be set to −20 dB for extremely strong situations.
5. Take the exemplary system to the next closest pole and perform a similar measurement. If the sound is stronger at this pole, turn the gain control down farther in order to achieve a sound level similar to that of step 3.
6. Repeat this process for all poles in the area that seem likely EMI sources based on the initial patrol. Do not turn the gain control up during the locating process.
7. The pole with the strongest signal is the best place to start inspecting hardware. If several poles show very similar readings, it may be likely that such poles are EMI sources.

In other exemplary embodiments, the process of performing a transmission line EMI survey may include a large number of measurements of EMI signal strengths are collected. The EMI signal strengths may be collected as once-per-second intensities and as time-domain waveforms. Criteria may be established to estimate the criticality of a located EMI source. Criticality is intended here to be a measure of the need to identify and correct the offending equipment in a timely manner. An example of this process is described below.
1. A one second signal level (peak 120 Hz component) must be high enough to trigger a waveform capture.
2. The detected signal level must demonstrate increasing intensity as the EMI source is approached, a maximum intensity must be achieved and decreasing intensity after passing the EMI source.
3. Based on the AEP TGIS, a transmission facility must be in close proximity (approximately 100 feet) to the indicated EMI source. This transmission facility may be a transmission tower, the conductor span between two towers, or a transmission substation.
4. If the site is approached on more than one or more vehicle pass, a high intensity signal must be present for more than 50% of the passes. In other exemplary embodiments, a high intensity signal may be present in at least one pass.
5. A steady, periodic pattern in a captured waveform indicates a less critical situation than an unstable, aperiodic signal.

Once a pole has been identified as a source of EMI, the exact piece of equipment causing the noise may be determined by the use of an exemplary embodiment of a system of the present invention on a hotstick.
1. Begin by setting the exemplary system's attenuation switch to 9 db and gain control to 10. Approach the hardware on the pole inspecting one item at a time. If a strong signal is detected, turn down the gain control until the sound produced is relatively quiet. The attenuation switch may be set to −20 dB for extremely strong situations.
2. Use the exemplary system to inspect each piece of equipment and each splice individually. Remember that EMI can be carried across conducting objects and can form standing wave patterns. Also, be aware that undamaged lightning arrestors can show high readings when there are other sources of EMI nearby.
3. Focus on the strongest sources of EMI first. There may be a chance that weaker "sources" may actually be standing wave reflections caused by the actual source.
4. If the exemplary system points to a connection, attempt to tighten or re-press the connection. If it points to an insulating device such as a pin insulator, cutout, dead end, etc., use a leakage current tester to verify if the insulator is leaking current. Replace any insulator that is leaking significant amounts of current.
5. If a lightning arrestor is found to be the strongest or only source, the lightning arrestor may be replaced. Check the new arrestor for EMI after installing. If the new arrestor also shows high levels of EMI, the real source of EMI may not have been found. It is possible that the actual source is on a nearby pole instead of the one being worked on.

It should be understood that other methods of use of an exemplary system of the present invention may be possible. Furthermore, the settings discussed in the aforementioned examples are only for purposes of example. Other variables are also possible.

Any embodiment of the present invention may include any of the optional or preferred features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to affect the described invention. Many of those variations and modifications will provide the same result and fall within the spirit of the claimed invention. It is the intention, therefore, to limit the invention only as indicated by the scope of the claims.

What is claimed is:

1. A system for detecting impaired electric power equipment that produces an increased level of electromagnetic radiation, said system comprising:
   a signal detection circuit adapted to produce an analog output that is proportional to a level of electromagnetic radiation;
   a band pass filter adapted to receive said analog output of said signal detection circuit comprising an $8^{th}$-order filter further comprising inductor-capacitor pairs embodying frequency cut-off characteristics to pass signals having frequencies in the range of about 130 MHz and 170 MHz and more preferably in the range of about 145 MHz and 155 MHz;
   an analog-to-digital converter in electrical communication with said band pass filter, said analog-to-digital converter adapted to convert an output of said band pass filter into a digital signal;
   a digital signal processing circuit adapted to receive said digital signal from said analog-to-digital converter and identify a modulation component associated with spiking and having a frequency component within a predetermined frequency band;
   a location tracking circuit adapted to receive location data;
   a timing circuit adapted to determine time data;
   a computing device in electrical communication with said timing circuit, said location tracking circuit, and said digital signal processing circuit, said computing device adapted to process data from said modulation component and said location data;
   a memory device in electrical communication with said computing device, said memory device adapted to store said data related to said modulation component and said location data; and
   a mapping program adapted to produce a map derived from said data from said modulation component and said location data wherein said mapping program is adapted to show the levels of electromagnetic radiation relative to said location data.

2. The system of claim 1 further comprising:
   an antenna in communication with said signal detection circuit; and
   wherein said antenna is adapted to receive electromagnetic radiation.

3. The system of claim 2 wherein said antenna is not resonant within the operating frequency range of electric power equipment that said system is adapted to survey.

4. The system of claim 2 wherein said antenna is resonant within the operating frequency range of electric power equipment that said system is adapted to survey.

5. The system of claim 2 wherein said antenna is a directional antenna.

6. The system of claim 1 wherein said analog output is adapted to be a voltage proportional to a time-varying level of electromagnetic radiation detected by said signal detection circuit in a predetermined frequency range.

7. The system of claim 1 wherein said signal detection circuit is adapted to detect electromagnetic radiation in a frequency range of about 2-11 MHz.

8. The system of claim 1 wherein said location tracking circuit and said timing circuit are provided by a global positioning system (GPS) circuit.

9. The system of claim 1 wherein said band pass filter is adapted to limit aliasing during conversion of said output of said band pass filter into said digital signal.

10. The system of claim 1 wherein said predetermined frequency band is inclusive of 120 Hz modulation.

11. The system of claim 1 wherein said predetermined frequency band is inclusive of a fundamental frequency of a source of electromagnetic radiation.

12. The system of claim 1 wherein said predetermined frequency band is inclusive of a second harmonic frequency of a source of electromagnetic radiation.

13. The system of claim 1 wherein said computing device is a microcontroller.

\* \* \* \* \*